(12) United States Patent
Daubenspeck et al.

(10) Patent No.: US 9,257,352 B2
(45) Date of Patent: Feb. 9, 2016

(54) SEMICONDUCTOR TEST WAFER AND METHODS FOR USE THEREOF

(71) Applicant: GLOBALFOUNDRIES INC., Grand Cayman (KY)

(72) Inventors: Timothy H. Daubenspeck, Colchester, VT (US); Jeffrey P. Gambino, Westford, VT (US); Christopher D. Muzzy, Burlington, VT (US); Wolfgang Sauter, Hinesburg, VT (US)

(73) Assignee: GlobalFoundries, Inc., Grand Cayman (KY)

( * ) Notice: Subject to any disclaimer, the term of this patent is extended or adjusted under 35 U.S.C. 154(b) by 321 days.

(21) Appl. No.: 13/835,358

(22) Filed: Mar. 15, 2013

(65) Prior Publication Data

US 2014/0266292 A1    Sep. 18, 2014

(51) Int. Cl.
*G01R 31/02* (2006.01)
*G01R 31/26* (2014.01)
*H01L 21/66* (2006.01)

(52) U.S. Cl.
CPC ..................... *H01L 22/34* (2013.01)

(58) Field of Classification Search
CPC ......... G01R 31/02; G01R 31/26; H01L 22/00
USPC .......... 324/762.01, 762.05, 762.02; 438/14–18; 257/48, E21.521; 716/706
See application file for complete search history.

(56) References Cited

U.S. PATENT DOCUMENTS

| | | | | |
|---|---|---|---|---|
| 4,860,079 A | * | 8/1989 | Turner | 257/48 |
| 5,596,207 A | * | 1/1997 | Krishnan et al. | 257/48 |
| 5,849,355 A | * | 12/1998 | McHenry | 427/79 |
| 6,380,618 B1 | | 4/2002 | Wang et al. | |
| 6,420,883 B1 | | 7/2002 | Watanabe et al. | |
| 6,649,986 B1 | | 11/2003 | Ishizaki et al. | |
| 6,686,750 B2 | | 2/2004 | Watanabe et al. | |
| 6,967,499 B1 | * | 11/2005 | Haase et al. | 324/762.03 |
| 6,998,638 B2 | | 2/2006 | Low et al. | |

(Continued)

FOREIGN PATENT DOCUMENTS

EP    2385551 A1 *   8/2011

OTHER PUBLICATIONS

Malta et al., "Fabrication of TSV-Based Silicon Interposers", IEEE International 3D Systems Integration Conference (3DIC), Nov. 16-18, 2010, p. 1-6.*

(Continued)

*Primary Examiner* — Patrick Assouad
*Assistant Examiner* — Lamarr Brown
(74) *Attorney, Agent, or Firm* — Anthony J. Canale; Hoffman Warnick LLC (57) ABSTRACT

A test wafer is disclosed with a first side configured to have integrated circuits formed thereon and a second side with a test structure formed thereon. The test wafer can include electrical test structures embedded in the second side of the wafer. An electrical test of the test wafer can be performed after handling by a tool used in a wafer manufacturing process to determine if the tool caused a defect on the second side of the wafer. The test structure can include a blanket layer disposed on the second side of the wafer. The test wafer can then be exposed to a wet etch and inspected thereafter for the presence of an ingress path caused from the etch chemistry. The presence of an ingress path is an indication that the tool used prior to the wet etch caused a defect in the wafer.

16 Claims, 5 Drawing Sheets

(56) References Cited

U.S. PATENT DOCUMENTS

| | | | |
|---|---|---|---|
| 7,250,311 | B2 | 7/2007 | Aoki et al. |
| 7,339,391 | B2 | 3/2008 | Lin |
| 7,391,219 | B2 | 6/2008 | Ahiko et al. |
| 7,772,868 | B2* | 8/2010 | Doong et al. ............ 324/762.03 |
| 7,851,793 | B2* | 12/2010 | Wang et al. ...................... 257/48 |
| 7,968,354 | B1* | 6/2011 | Haller et al. .................... 438/14 |
| 2004/0235205 | A1* | 11/2004 | Levy et al. ...................... 438/14 |
| 2005/0212147 | A1 | 9/2005 | Nishizawa |
| 2006/0169977 | A1* | 8/2006 | Lee et al. ........................ 257/48 |
| 2008/0012572 | A1 | 1/2008 | Tsukuda |
| 2008/0122476 | A1* | 5/2008 | Wang et al. ................... 324/769 |
| 2008/0246491 | A1 | 10/2008 | Ogawa et al. |
| 2009/0002012 | A1* | 1/2009 | Doong et al. ................. 324/765 |
| 2009/0051358 | A1 | 2/2009 | Shirasaka et al. |
| 2009/0201043 | A1 | 8/2009 | Kaltalioglu |
| 2010/0156453 | A1* | 6/2010 | Doong et al. ................. 324/765 |
| 2011/0168995 | A1* | 7/2011 | Doong et al. ................... 257/48 |
| 2011/0248263 | A1* | 10/2011 | Augur ............................ 257/48 |
| 2012/0299610 | A1* | 11/2012 | Bieck ....................... 324/754.03 |
| 2014/0167043 | A1* | 6/2014 | Zundel et al. ................... 257/48 |

OTHER PUBLICATIONS

Yamamoto et al., "Development of a Large-Scale TEG for Evaluation and Analysis of Yield and Variation", IEEE Transactions on Semiconductor Manufacturing, vol. 17, No. 2, May 2004, p. 111-122.*

Bhushan et al., "Microelectronic Test Structures for Cmos Technology", Chapter 4, 2011, pp. 1-40.*

* cited by examiner

SEMICONDUCTOR TEST WAFER AND METHODS FOR USE THEREOF

BACKGROUND

Embodiments of the present invention relate generally to semiconductor device fabrication, and more specifically, to detecting defects that form on the backside of a wafer during a wafer manufacturing process of an integrated circuit or semiconductor die and lead to chip cracking.

Bonding and assembly of a semiconductor die to a semiconductor chip package substrate during chip packaging is one aspect in which defects can arise during a wafer manufacturing process of a die. In a typical bonding and assembly process of a semiconductor die to a semiconductor chip package substrate, solder bumps are attached to respective bond pads formed on the die. The semiconductor die is then placed onto the semiconductor chip package substrate. A reflow is performed to join the solder bumps on the semiconductor die to respective bond pads on the semiconductor chip package substrate. Typically, there is a high degree of mismatch between the coefficients of thermal expansion (CTE) between the semiconductor die and the semiconductor chip package substrate. The mismatch of CTE results in the formation of large strains that cause thermal stresses to develop about the solder bumps and the semiconductor die during thermal exposures. In particular, during the semiconductor die-join and cool-down, the mismatch of CTE between the semiconductor die and the semiconductor chip package substrate results in warpage of the semiconductor die and semiconductor chip package substrate. This warpage creates tensile stress on the backside of the semiconductor die. Due to the brittle nature of silicon, any defect on the backside of the semiconductor die makes it very sensitive to this tensile stress. As a result, the semiconductor die may fracture or crack.

Any fractures or cracks that arise during the bonding and assembly of a semiconductor die with a semiconductor chip package substrate via the solder bumps may be further exasperated during a subsequent underfilling process in which the under-chip space between the die and the substrate is filled with a non-conductive "underfill". The underfill protects the solder bumps from moisture or other environmental hazards, and provides additional mechanical strength to the assembly of the semiconductor die to the semiconductor chip package substrate. However, like the bonding and assembly of a semiconductor die to a semiconductor chip package substrate via the solder bumps, the defects in the backside of the semiconductor die can become further stressed during the underfilling process.

In a typical underfilling process, a cure is performed to join the underfill material with the semiconductor die, the semiconductor chip package substrate and the solder bumps. The mismatch between the CTEs between the underfill material, the semiconductor die, the semiconductor chip package substrate and the solder bumps results in further thermal stresses on the backside of the semiconductor die. As a result, during the join and cool-down of the underfill material, the mismatch of CTE between the semiconductor die, the underfill material and the semiconductor chip package substrate results in warpage of the semiconductor die and semiconductor chip package substrate. This warpage creates tensile stress on the backside of the semiconductor die. Due to the brittle nature of silicon, any defect on the backside of the semiconductor die makes it very sensitive to this tensile stress. As a result, the semiconductor die may fracture or crack.

Since a typical wafer manufacturing process has a multitude of operations, it is conceivable that each of these operations can create a defect on the backside of a wafer that can lead to fractures or cracks in the semiconductors dies that are fabricated in the process. These defects can have an effect on the reliability and yield of the semiconductor die fabricated from such a wafer manufacturing process. Semiconductor manufacturers can utilize defect evaluation methods during the wafer manufacturing process in order to mitigate the effect that defects in the backside of the wafer can have on the reliability and yield of a semiconductor die, but these methods are cumbersome and generally not adept at distinguishing cosmetic defects (e.g., scratches, discolorations, etc.) that occur in large numbers on the backside of the wafers during the wafer manufacturing process from critical defects that lead to fractures and cracks in the die.

SUMMARY

In one embodiment, a test device is provided. In this embodiment, the test device comprises a wafer having a first side configured to have integrated circuits formed thereon and a second side with a test structure formed thereon. The test structure is configured to facilitate characterization of a critical defect on the second side of the wafer that is caused by any of a plurality of tools used in a wafer manufacturing process.

In a second embodiment, a method is provided. In this embodiment, the method comprises obtaining a test wafer having a first side configured to have integrated circuits formed thereon and a second side with a test structure formed thereon; selecting one of a plurality of tools used in a wafer manufacturing process as a tool of interest; running the test wafer through a wafer manufacturing process performed by the selected tool of interest; and performing a test on the test structure on the second side of the wafer after handling by the selected tool to determine if the selected tool caused a critical defect.

In a third embodiment, a method is provided. In this embodiment, the method comprises obtaining a test wafer having a first side configured to have integrated circuits formed thereon and a second side with a plurality of electrical test structures embedded therein; selecting one of a plurality of tools used in a wafer manufacturing process as a tool of interest; running the test wafer through a wafer manufacturing process performed by the selected tool of interest; probing each of the electrical test structures on the second side of the wafer after handling by the selected tool to obtain a test resistance measurement for each structure; comparing the test resistance measurements of each of the electrical test structures to an initial reference set of resistance measurements for each of the test structures, the initial reference set of resistance measurements indicative of a wafer without a critical defect; and determining whether there are differences between the test resistance measurements and the initial reference set of resistance measurements, wherein a difference between the test resistance measurements and the initial reference set of resistance measurements is an indication that the selected tool is a source for causing the critical defect during the wafer manufacturing process, and a correspondence between the test resistance measurements and the initial reference set of resistance measurements is an indication that the selected tool is operating within the wafer manufacturing process without causing a critical defect.

In a fourth embodiment, a method is provided. In this embodiment, the method comprises obtaining a test wafer having a first side configured to have integrated circuits formed thereon and a second side that includes an embedded blanket layer of copper; selecting one of a plurality of tools used in a wafer manufacturing process as a tool of interest;

running the test wafer through a wafer manufacturing process performed by the selected tool of interest; exposing the test wafer to a wet etch; and inspecting the embedded blanket layer of copper after exposing the test wafer to the wet etch for a presence of an ingress path caused from etch chemistry associated with the wet etch flowing thereto, the ingress path is an indication that the tool used prior to exposing the test wafer with the wet etch caused a critical defect in the wafer.

DETAILED DESCRIPTION

Figure 1:
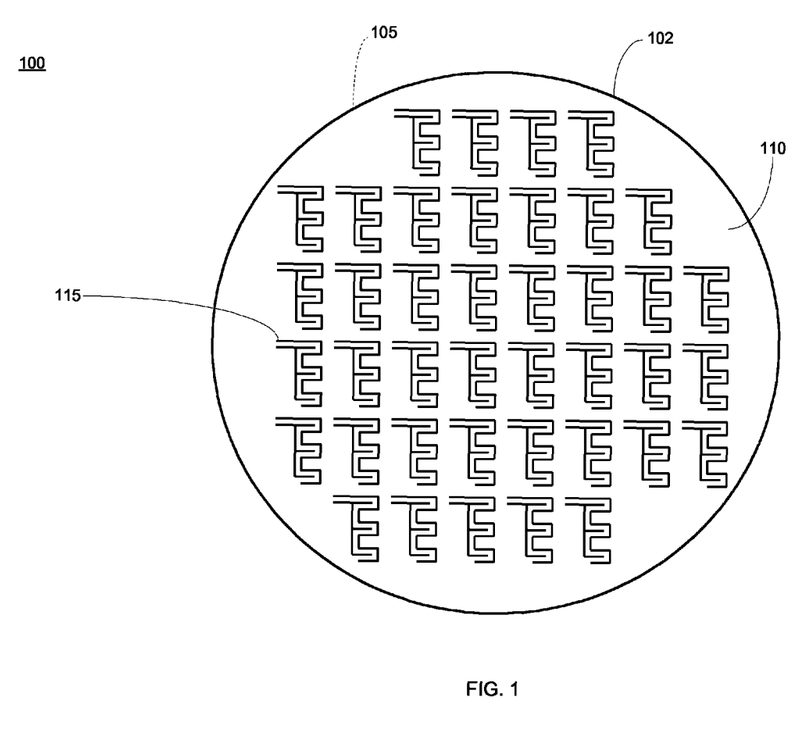
FIG. 1 shows a top view of a test device that may be utilized to detect defects that can form on the backside of a wafer during a wafer manufacturing process according to one embodiment of the present invention.

FIG. 1 shows a top view of a test device 100 that may be utilized to detect defects that can form on the backside of a wafer during a wafer manufacturing process according to one embodiment of the present invention. In one embodiment, test device 100 comprises a wafer 102 having a first side 105 configured to have semiconductor dies or integrated circuits formed thereon and a second side 110 with a plurality of electrical test structures 115 formed thereon. For clarity, FIG. 1 shows more of second side 110 as opposed to first side 105 which is labeled with dashed lines to denote that first side 105 is on the opposite side of second side 110. In one embodiment, first side 105 can be referred to as the front side of wafer 102 because the integrated circuits would be formed thereon, and second side 110 can be referred to as the backside of the wafer. Those skilled in the art will appreciate that sides 105 and 110 are interchangeable in that each can function as the front side or the backside of wafer 102. For purposes of explaining the various embodiments of the present invention, the description that follows refers to first side 105 of wafer 102 as the front side and second side 110 of the wafer as the backside. Furthermore, those skilled in the art will appreciate that the front side of wafer 102 need not have integrated circuits formed thereon since the wafer is generally a test device used to test the backside of a wafer for defects that can form on a wafer during a wafer manufacturing process.

In one embodiment, electrical test structures 115 can facilitate the characterization of defects that arise on the backside of a wafer through any of a plurality of tools used in a wafer manufacturing process through an electrical test. As described below in more detail, the wafer 102 with electrical test structures 115 can be used to test whether any of the tools used in a wafer manufacturing process are the cause for critical defects forming on the backside of the wafer. Critical defects as used herein are defects that generally have a depth that is at least 10 to 20 microns within the backside of the wafer, which is sufficient enough to lead to chip cracks or fractures. Cosmetic defects such as scratches and discolorations can generally extend up to 2 microns within the backside of the wafer are not sufficient enough to lead to chip cracks or fractures.

If it is determined that one of the tools has caused a critical defect as detected by electrical test structures 115, then that is an indication that this tool is a root cause for creating these types of defects in a wafer that is processed in a particular wafer manufacturing process. As explained below in more detail, with this indication, the critical defect caused by the tool can be characterized with information such as the depth of the defect, the type of defect, the impact the defect has on the chip. This characterization information can then enable a process technician to provide fixes to the tool that obviates this critical defect in future yields.

Figure 2A:
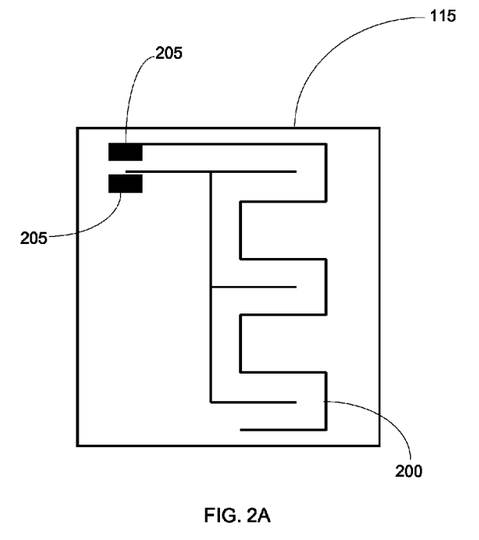
FIGS. 2A-2B show a more detailed view of one of the electrical test structures embedded in the test device of FIG. 1 according to one embodiment of the present invention.
Figure 2B:
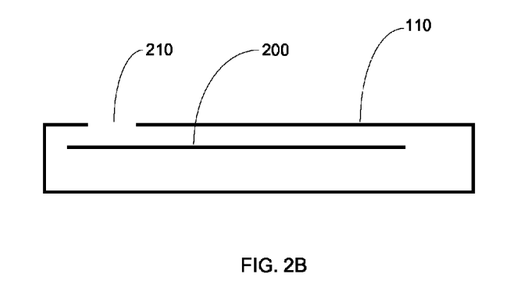

FIGS. 2A-2B show a more detailed view of one of the electrical test structures 115 embedded in test device 100 according to one embodiment of the present invention. In particular, FIG. 2A shows a top view of one electrical test structure 115, while FIG. 2B shows a cross-sectional view of the electrical test structure. As shown in FIG. 2A, electrical test structure 115 contains wiring (e.g., polysilicon, copper, or aluminum wiring) 200 disposed in the form of a geometric pattern. In one embodiment, wiring 200 can take the form of a serpentine/comb structure. Those skilled in the art will appreciate that the serpentine/comb structure is illustrative of one example of an electrical test structure that can be patterned on second side 110 of wafer 102. Other geometric patterns are within the scope of the various embodiments of the present invention. In addition, these geometric patterns can be embedded in test device 100 using any of a number of well-known patterning techniques.

Generally, a hard dielectric layer such as, for example, silicon oxide would be disposed over these geometric patterned test structures in order to facilitate a determination of depth that any detected defect would have with respect to the backside or second side 110 of wafer 102. In one embodiment, second side 110 can have multiple levels of electrical test structures 115 embedded there underneath the hard dielectric layer in order to facilitate different depth detection of any critical defects within the backside of the wafer.

FIGS. 2A-2B show that electrical test structure 115 further comprises test pads 205 that enables an electric probe to contact via a probe opening 210. In this manner, the electric probe can then be moved along one end of wiring 200 to another end all while taking resistance measurements along the wiring. In one embodiment, these resistance measurements can then be compared to an initial reference set of resistance measurements that are obtained prior to using test structure 100 to evaluate the handling of any tools in the wafer manufacturing process. In general, the initial reference set of resistance measurements contain values that are indicative of a wafer that is free of critical defects. If during the comparison of the resistance measurements to the initial reference set of resistance measurements it is determined that there is a difference, then this would be an indication of an electrical fail in the measurements taken after handling by the tool. More specifically, the electrical fail would be an indication that the tool of interest has caused a critical defect. A process technician could then ascertain the depth of the defect, the x-y location of the defect on the wafer, the type of defect, the impact the defect has on the chip and fix the tool to prevent future critical defects. On the other hand, if during the comparison of the resistance measurements to the initial reference set of resistance measurements it is determined that there is a correspondence between the resistance measurements, then this would be an indication that the selected tool is operating within the wafer manufacturing process without causing a critical defect.

Figure 3A:
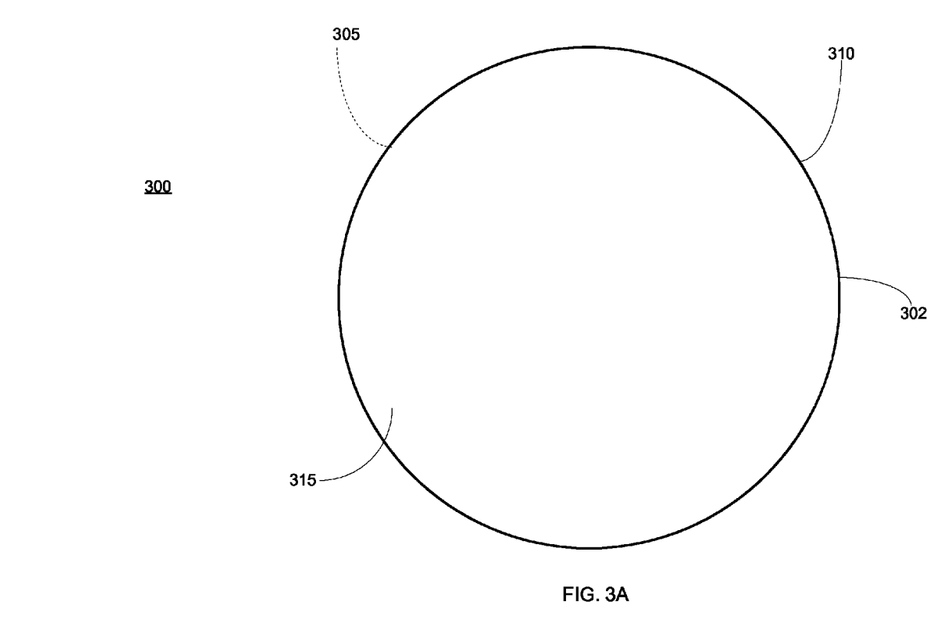
FIGS. 3A-3B show another test device that may be utilized to detect defects that can form on the backside of a wafer during a wafer manufacturing process according to a second embodiment of the present invention.
Figure 3B:
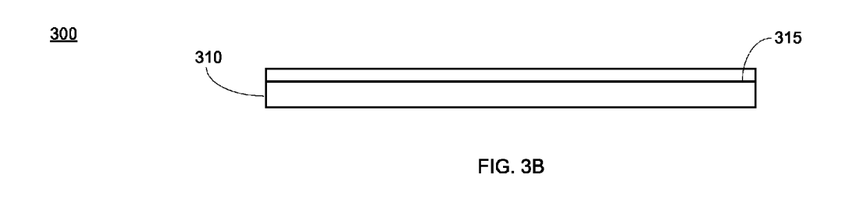

FIGS. 3A-3B show another test device 300 that may be utilized to detect defects that can form on the backside of a wafer during a wafer manufacturing process according to a second embodiment of the present invention. In particular, FIG. 3A shows a top view of test device 300 while FIG. 3B shows a cross-sectional view of the device. In one embodiment, test device 300 comprises a wafer 302 having a first side 305 configured to have semiconductor dies or integrated circuits formed thereon and a second side 310 with a test structure 315 embedded therein. Like FIG. 1, for purposes of describing the various embodiments of the present invention, FIG. 3A shows more of second side 310 as opposed to first side 305 which is labeled with dashed lines to denote that first side 305 is on the opposite side of second side 310. In one embodiment, first side 305 can be referred to as the front side of wafer 302 because the integrated circuits would be formed thereon, and second side 310 can be referred to as the backside of the wafer. Those skilled in the art will appreciate that sides 305 and 310 are interchangeable in that each can function as the front side or the backside of wafer 302. For purposes of explaining the various embodiments of the present invention, the description that follows refers to first side 305 of wafer 302 as the front side and second side 310 of the wafer as the backside. Furthermore, those skilled in the art will appreciate that the front side of wafer 302 need not have integrated circuits formed thereon since the wafer is generally a test device used to test the backside of a wafer for defects that can form on a wafer during a wafer manufacturing process.

In one embodiment, test structure 315 is an embedded blanket layer. In one embodiment, the embedded blanket layer can comprise a copper layer. The copper layer when used in conjunction with a wet etch can facilitate an optical visualization of any defects created on the backside of test device 300 by any of the tools used in a wafer manufacturing process that would process a wafer in a typical operation. In particular, the copper layer can exhibit an ingress path for the etch chemistry used in the wet etch to flow if a defect was created by one of the tools. Thus, if an ingress path is visible after exposing test device 300 to the wet etch, then this would be an indication that the tool used prior to the wet etch caused a critical defect in the backside of wafer 302. Therefore, it can be deduced that this tool is causing critical defects to occur in the wafer manufacturing process. A process technician could then ascertain the depth of the defect, the x-y location of the defect on the wafer, the type of defect, the impact the defect has on the chip and fix the tool to prevent future critical defects.

Although the embedded blanket layer of test structure 315 is described in one embodiment as comprising a copper layer, those skilled in the art will recognize that other types of blanket layers can be used as the test structure. Generally, test structure 315 can be any blanket layer that is known to react with a wet etch in such a manner that would exhibit an ingress path as a result of some type of damage done to the backside or second side 310 of the wafer. These test structure layers can be embedded in test device 300 using any of a number of well-known patterning techniques.

Generally, a hard dielectric layer such as silicon oxide would be disposed over the test structure 315 in order to facilitate a determination of depth that any detected defect would have with respect to the backside or second side 310 of wafer 302. In one embodiment, second side 310 can have multiple levels of test structure 315 layers embedded underneath the hard dielectric layer in order to facilitate different depth detection of any critical defects within the backside of the wafer.

Figure 4:
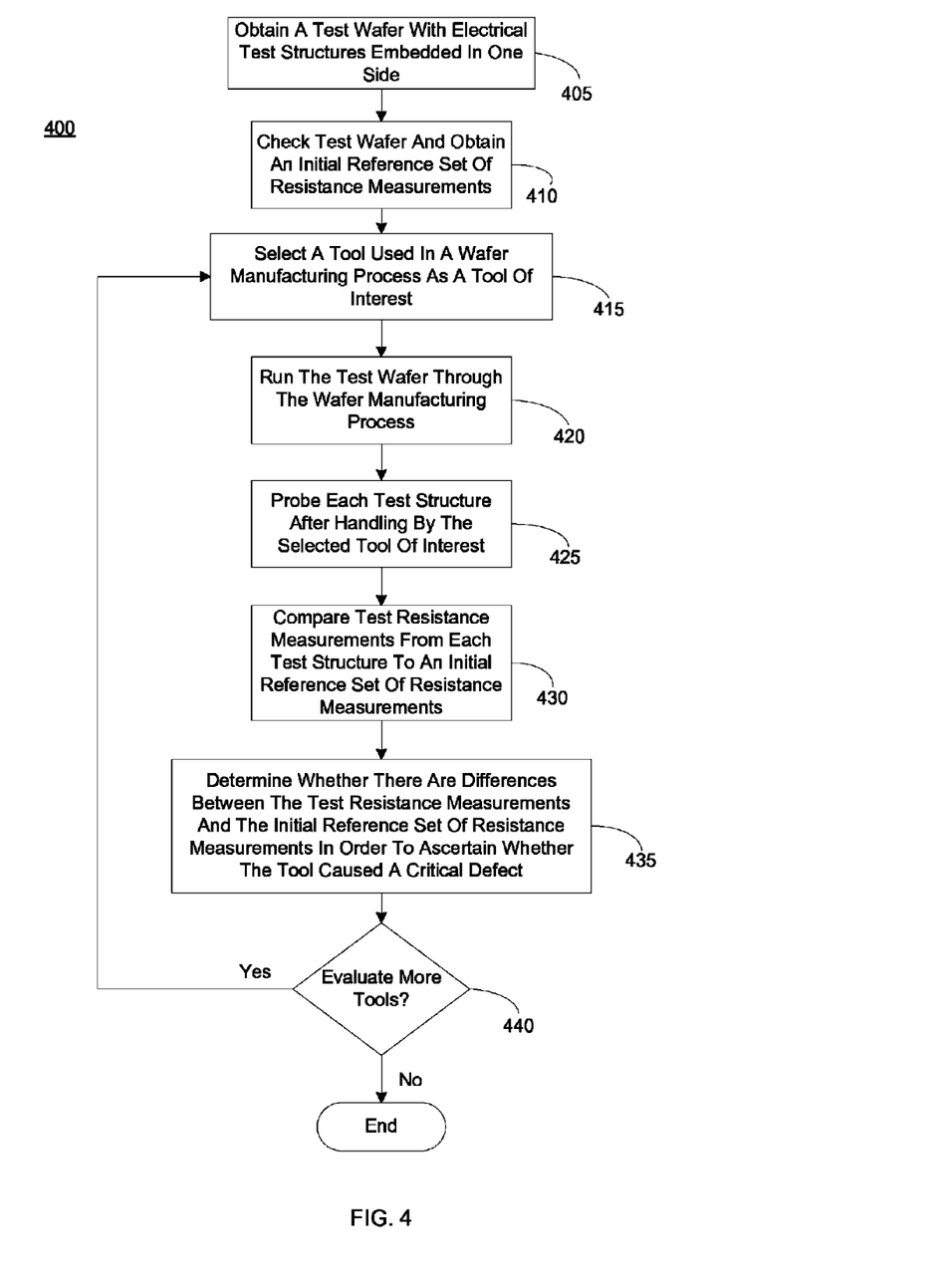
FIG. 4 shows a flow chart describing operations of using the test device depicted in FIG. 1 to detect defects that can form on the backside of a wafer during a wafer manufacturing process according to one embodiment of the present invention.

FIG. 4 shows a flow chart 400 describing operations of using the test device 100 depicted in FIG. 1 to detect defects that can form on the backside of a wafer during a wafer manufacturing process according to one embodiment of the present invention. In FIG. 4, operations begin at 405 by obtaining a test wafer having a first side configured to have integrated circuits formed thereon and a second side with a plurality of electrical test structures embedded therein. The test structures of the test wafer can then be checked at 410 to make sure that none of the structures exhibit electrical fails. In particular, in one embodiment, an electrical tester would apply a probe to each of the electrical structures running it along from end to end while taking resistance measurements. If the resistance measurements did not indicate any type of electrical fails, then the test wafer can be run through any of the tools in the wafer manufacturing process. In addition, these reference measurements can be designated as an initial reference set and as explained below, compared with resistance measurements obtained after running the test wafer through each of the tools in the wafer manufacturing process.

Flow chart 400 continues at 415, where one of the tools in the wafer manufacturing process is selected as a tool of interest. That is, the test wafer will be handled and run through the process performed by the selected tool to determine if it is causing critical defects to the backside of the wafer. For example, a process technician can choose to test a process tool that is believed to be causing defects although it has not been substantiated. The test wafer is then run through a wafer manufacturing process performed by the selected tool of interest at 420. After the tool has completed its process operations, then the test wafer is removed from the tool and the backside of the wafer where the electrical test structures are embedded are probed at 425. In one embodiment, an electrical tester would apply a probe to each of the electrical structures in the backside and run the along from end to end while taking test resistance measurements.

The test resistance measurements are then compared to the initial reference set of resistance measurements at 430. Since the initial reference set of resistance measurements were obtained when the test wafer was deemed to not have any electrical fails, then these initial reference set of resistance measurements are indicative of a wafer without a critical defect. If it is determined at 435 that there is a difference between the test resistance measurements and the initial reference set of resistance measurements, then this is an indication that the selected tool has caused a critical defect to the test wafer while running it respective process. On the other hand, if the test resistance measurements correspond with the initial reference set of resistance measurements, then this is an indication that the selected tool did not cause a critical defect to the test wafer while running it respective process.

Flow chart 400 continues at 440 where it is determined if it is desirable to test any other tools in the wafer manufacturing process to ascertain whether these tools are creating critical defects while performing its respective operations. If it is desired to evaluate more tool as determined at 440, then steps 415 through 430 are repeated until it is determined that no more tools need to be evaluated.

Figure 5:
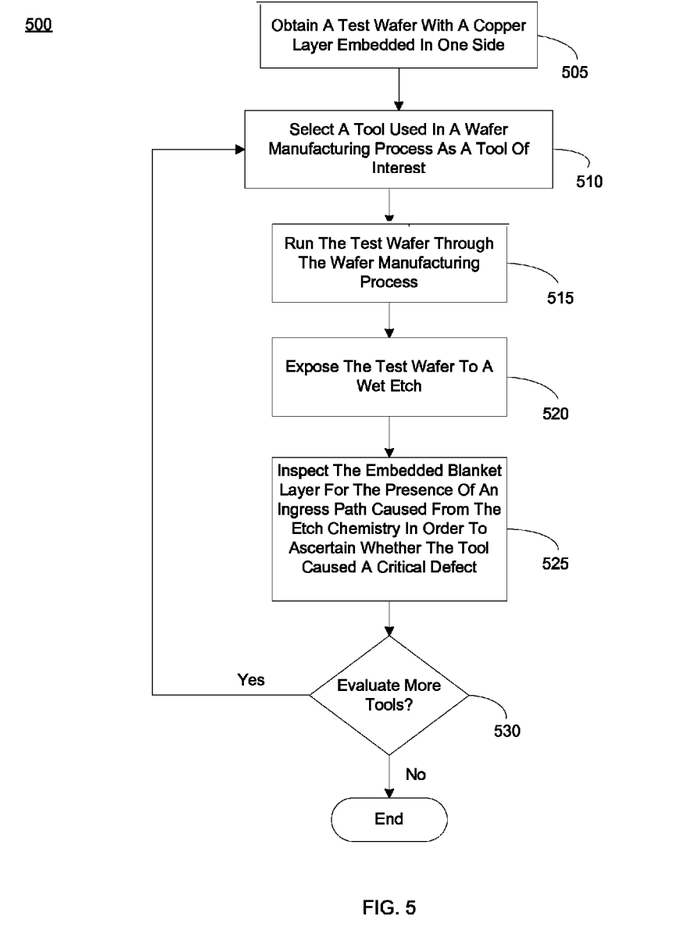
FIG. 5 shows a flow chart describing operations of using the test device depicted in FIGS. 3A-3B to detect defects that can form on the backside of a wafer during a wafer manufacturing process according to one embodiment of the present invention.

FIG. 5 shows a flow chart 500 describing operations of using the test device 300 depicted in FIGS. 3A-3B to detect defects that can form on the backside of a wafer processed during a wafer manufacturing process. In FIG. 5, operations begin at 505 by obtaining a test wafer having a first side configured to have integrated circuits formed thereon and a second side with a blanket layer (e.g., copper layer) embedded therein. One of the tools in the wafer manufacturing process is selected as a tool of interest at 510. That is, the test wafer will be handled and run through the process performed by the selected tool to determine if it is causing critical defects to the backside of the wafer. The test wafer is then run through a wafer manufacturing process performed by the selected tool of interest at 515.

After the tool has completed its process operations, then the test device is removed from the tool and exposed to a wet etch at 520. The embedded blanket layer is then inspected at 525 after exposing the test wafer to the wet etch for a presence of an ingress path caused from etch chemistry associated with the wet etch. If it is determined that there is an ingress path caused by the etch chemistry, then this is an indication that the tool used prior to exposing the test wafer with the wet etch caused a critical defect in the wafer. On the other hand, if it is determined that there is no ingress path, then this is an indication that the tool used prior to exposing the test wafer with the wet etch is operating without causing any critical defects to arise in the wafer.

Flow chart 500 continues at 530 where it is determined if it is desirable to test any other tools in the wafer manufacturing process to ascertain whether these tools are creating critical defects while performing their respective operations. If it is desired to evaluate more tool as determined at 530, then steps 510 through 520 are repeated until it is determined that no more tools need to be evaluated.

The foregoing flow chart shows some of the processing functions associated with testing whether a wafer manufacturing process tool is creating critical defects to wafers being handled by these tools. In this regard, each block represents a process act associated with performing these functions. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe the processing functions may be added.

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the disclosure.

What is claimed is:

1. A test device, comprising:
a wafer having a first side configured to have integrated circuits formed thereon and a second side with a test structure formed thereon, wherein the test structure is configured to facilitate characterization of a critical defect on the second side of the wafer that is caused by any of a plurality of tools used in a wafer manufacturing process, and wherein the test structure is chosen from a group consisting of: a plurality of test structures embedded in the second side of the wafer and a blanket layer of copper embedded in the second side of the wafer.

2. The test device according to claim 1, wherein the test structure includes the plurality of test structures embedded in the second side of the wafer, and wherein each of the plurality of electrical test structures include a predetermined geometric pattern.

3. The test device according to claim 1, wherein each of the plurality of electrical test structures are configured to have an electrical test performed thereon after handling by any of the plurality of tools used in the wafer manufacturing process, an electrical fail occurring at any of the electrical test structures after handling by one of the plurality of tools is an indication that the tool caused the critical defect in the wafer.

4. The test device according 1, wherein the test structure includes the blanket layer of copper embedded in the second side of the wafer, and wherein the blanket layer of copper layer is configured to visually exhibit an ingress path for etch chemistry to flow thereto in response to exposing the wafer to a wet etch, the wafer undergoing the wet etch after handling by any of the plurality of tools used in the wafer manufacturing process, the ingress path is an indication that the tool used prior to the wet etch caused the critical defect in the wafer.

5. A method, comprising:
obtaining a test wafer having a first side configured to have integrated circuits formed thereon and a second side with a test structure formed thereon, wherein the test structure is chosen from a group consisting of: a plurality of electrical structures embedded in the second side of the wafer and an embedded blanket layer of copper disposed on the second side of the wafer;
selecting one of a plurality of tools used in a wafer manufacturing process as a tool of interest;
running the test wafer through a wafer manufacturing process performed by the selected tool of interest; and
performing a test on the test structure on the second side of the wafer after handling by the selected tool to determine if the selected tool caused a critical defect.

6. The method according to claim 5, wherein the test structure includes the plurality of electrical test structures embedded in the second wafer, and wherein the performing of the test on the test structure includes performing an electrical test.

7. The method according to claim 6, wherein the performing of the electrical test includes probing each of the electrical test structures to obtain a test resistance measurement for each structure.

8. The method according to claim 7, further comprising comparing the test resistance measurements of each of the electrical test structures from the electrical test to an initial reference set of resistance measurements for each of the electrical test structures, the initial reference set of resistance measurements indicative of a wafer without a critical defect.

9. The method according to claim 8, further comprising determining whether there are differences between the test resistance measurements and the initial reference set of resistance measurements, wherein a difference between the test resistance measurements and the initial reference set of resistance measurements is an indication that the selected tool is a source for causing the critical defect during the wafer manufacturing process, and a correspondence between the test resistance measurements and the initial reference set of resistance measurements is an indication that the selected tool is operating within the wafer manufacturing process without causing the critical defect.

10. The method according to claim 6, further including performing an initial electrical test on the electrical test structures on the second side of the wafer prior to applying the test wafer to any of the plurality of tools to determine if there is an electrical fail of any of the electrical test structures.

11. The method according to claim 6, further including selecting another of the plurality of tools used in the wafer manufacturing process as a next tool of interest, running the test wafer through the next tool of interest and performing the electrical test on the electrical test structures on the second side of the wafer after handling by the next tool of interest to determine if there is an electrical fail of any of the electrical test structures.

12. The method according to claim 5, wherein the test structure includes the blanket layer of copper disposed on the second wafer, and wherein the performing of the test on the test structure includes exposing the test wafer to a wet etch.

13. The method according to claim 12, further comprising inspecting the embedded blanket layer of copper after exposing the test wafer to the wet etch for a presence of an ingress path caused from etch chemistry associated with the wet etch flowing thereto, the ingress path is an indication that the tool used prior to exposing the test wafer with the wet etch caused the critical defect in the wafer.

14. The method according to claim 13, further including selecting another of the plurality of tools used in the wafer manufacturing process as a next tool of interest, running the test wafer through the next tool of interest, exposing the test wafer to another wet etch in response to running the test wafer through the next tool of interest, and inspecting the embedded blanket layer of copper after exposing the test wafer to the wet etch for a presence of an ingress path.

15. A method, comprising:
   obtaining a test wafer having a first side configured to have integrated circuits formed thereon and a second side with a plurality of electrical test structures embedded therein;
   selecting one of a plurality of tools used in a wafer manufacturing process as a tool of interest;
   running the test wafer through a wafer manufacturing process performed by the selected tool of interest;
   probing each of the electrical test structures on the second side of the wafer after handling by the selected tool to obtain a test resistance measurement for each structure;
   comparing the test resistance measurements of each of the electrical test structures to an initial reference set of resistance measurements for each of the test structures, the initial reference set of resistance measurements indicative of a wafer without a critical defect; and
   determining whether there are differences between the test resistance measurements and the initial reference set of resistance measurements, wherein a difference between the test resistance measurements and the initial reference set of resistance measurements is an indication that the selected tool is a source for causing the critical defect during the wafer manufacturing process, and a correspondence between the test resistance measurements and the initial reference set of resistance measurements is an indication that the selected tool is operating within the wafer manufacturing process without causing a critical defect.

16. A method, comprising:
   obtaining a test wafer having a first side configured to have integrated circuits formed thereon and a second side that includes an embedded blanket layer of copper;
   selecting one of a plurality of tools used in a wafer manufacturing process as a tool of interest;
   running the test wafer through a wafer manufacturing process performed by the selected tool of interest;
   exposing the test wafer to a wet etch; and
   inspecting the embedded blanket layer of copper after exposing the test wafer to the wet etch for a presence of an ingress path caused from etch chemistry associated with the wet etch flowing thereto, the ingress path is an indication that the tool used prior to exposing the test wafer with the wet etch caused a critical defect in the wafer.

* * * * *